(12) United States Patent
Okubo

(10) Patent No.: US 10,527,245 B2
(45) Date of Patent: Jan. 7, 2020

(54) LIGHTING FIXTURE FOR VEHICLE

(71) Applicant: Ichikoh Industries, Ltd., Isehara-shi (JP)

(72) Inventor: Yasuhiro Okubo, Isehara (JP)

(73) Assignee: Ichikoh Industries, Ltd., Isehara-shi (JP)

( * ) Notice: Subject to any disclaimer, the term of this patent is extended or adjusted under 35 U.S.C. 154(b) by 0 days.

(21) Appl. No.: 16/324,019

(22) PCT Filed: Aug. 9, 2017

(86) PCT No.: PCT/JP2017/028936
§ 371 (c)(1),
(2) Date: Feb. 7, 2019

(87) PCT Pub. No.: WO2018/030469
PCT Pub. Date: Feb. 15, 2018

(65) Prior Publication Data
US 2019/0178459 A1    Jun. 13, 2019

(30) Foreign Application Priority Data

Aug. 9, 2016  (JP) .................................. 2016-157020

(51) Int. Cl.
*F21S 41/148* (2018.01)
*F21S 45/47* (2018.01)
(Continued)

(52) U.S. Cl.
CPC .......... *F21S 41/148* (2018.01); *F21S 41/255* (2018.01); *F21S 41/663* (2018.01); *F21S 45/47* (2018.01);
(Continued)

(58) Field of Classification Search
CPC ...... F21S 41/148; F21S 41/663; F21S 41/255; F21S 45/47; H01L 25/0753; H01L 33/502;
(Continued)

(56) References Cited

U.S. PATENT DOCUMENTS

| 2011/0170310 A1 | 7/2011 | Haenen et al. |
| 2012/0026747 A1* | 2/2012 | Hayashi ................. F21V 31/04 362/520 |

(Continued)

FOREIGN PATENT DOCUMENTS

| JP | 2012-503287 A | 2/2012 |
| JP | 2013-20709 A | 1/2013 |
| JP | 2014-36202 A | 2/2014 |

OTHER PUBLICATIONS

International Search Report dated Nov. 7, 2017, in PCT/JP2017/028936 filed on Aug. 9, 2017.

*Primary Examiner* — Ali Alavi
(74) *Attorney, Agent, or Firm* — Oblon, McClelland, Maier & Neustadt, L.L.P.

(57) ABSTRACT

A lighting fixture for vehicle is provided with light source and lens, the light source comprising substrate, first light-emitting part having first base substrate provided on the substrate, and a plurality of second light-emitting parts positioned on the outside of first light-emitting part in horizontal direction and having second base substrate provided on the substrate. The first light-emitting part comprises a pair of first light-emitting chip parts provided on first base substrate with first separating part interposed therebetween. Each of the plurality of second light-emitting parts is equipped with a second light-emitting chip part obtained by covering, with a phosphor, a second light-emitting chip mounted on a second base substrate with the light-emitting layer side as the second base substrate side. The pair of first
(Continued)

101R  102    101L light-emitting chip parts comprise a first light-emitting chip mounted on the first base substrate, and a phosphor that covers the first light-emitting chip.

9 Claims, 9 Drawing Sheets

(51) Int. Cl.
| | |
|---|---|
| *F21S 41/255* | (2018.01) |
| *F21S 41/663* | (2018.01) |
| *H01L 25/075* | (2006.01) |
| H01L 33/50 | (2010.01) |
| H01L 33/32 | (2010.01) |
| H01L 33/06 | (2010.01) |
| H01L 33/00 | (2010.01) |
| H01L 33/14 | (2010.01) |

(52) U.S. Cl.
CPC ...... *H01L 25/0753* (2013.01); *H01L 33/0025* (2013.01); *H01L 33/06* (2013.01); *H01L 33/145* (2013.01); *H01L 33/32* (2013.01); *H01L 33/502* (2013.01)

(58) Field of Classification Search
CPC ..... H01L 33/32; H01L 33/06; H01L 33/0025; H01L 33/145; H01L 33/56; H01L 33/58
USPC .......................................................... 362/520
See application file for complete search history.

(56) References Cited

U.S. PATENT DOCUMENTS

| | | | |
|---|---|---|---|
| 2012/0195058 A1* | 8/2012 | Uchida | ................. F21S 41/255 362/520 |
| 2015/0016136 A1* | 1/2015 | Nakano | ................. F21S 43/195 362/520 |
| 2015/0049504 A1* | 2/2015 | Wu | ........................ F21S 41/19 362/517 |

* cited by examiner

[FIG. 1]
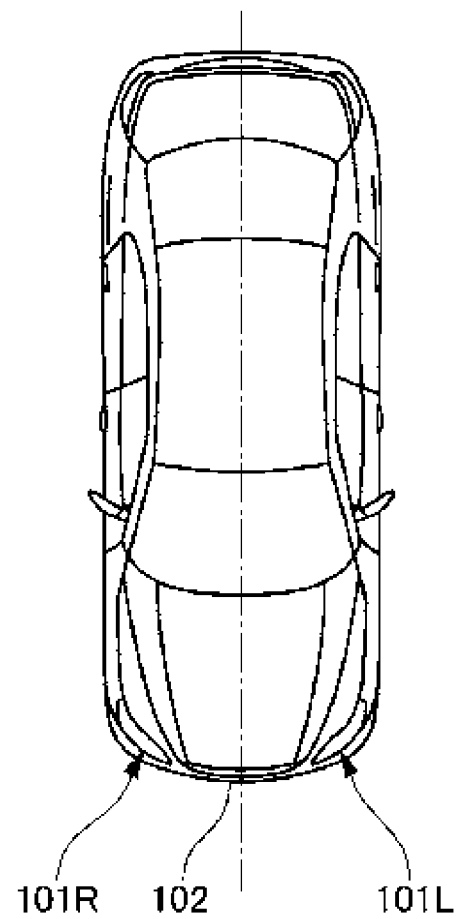
101R   102   101L

[FIG. 2]
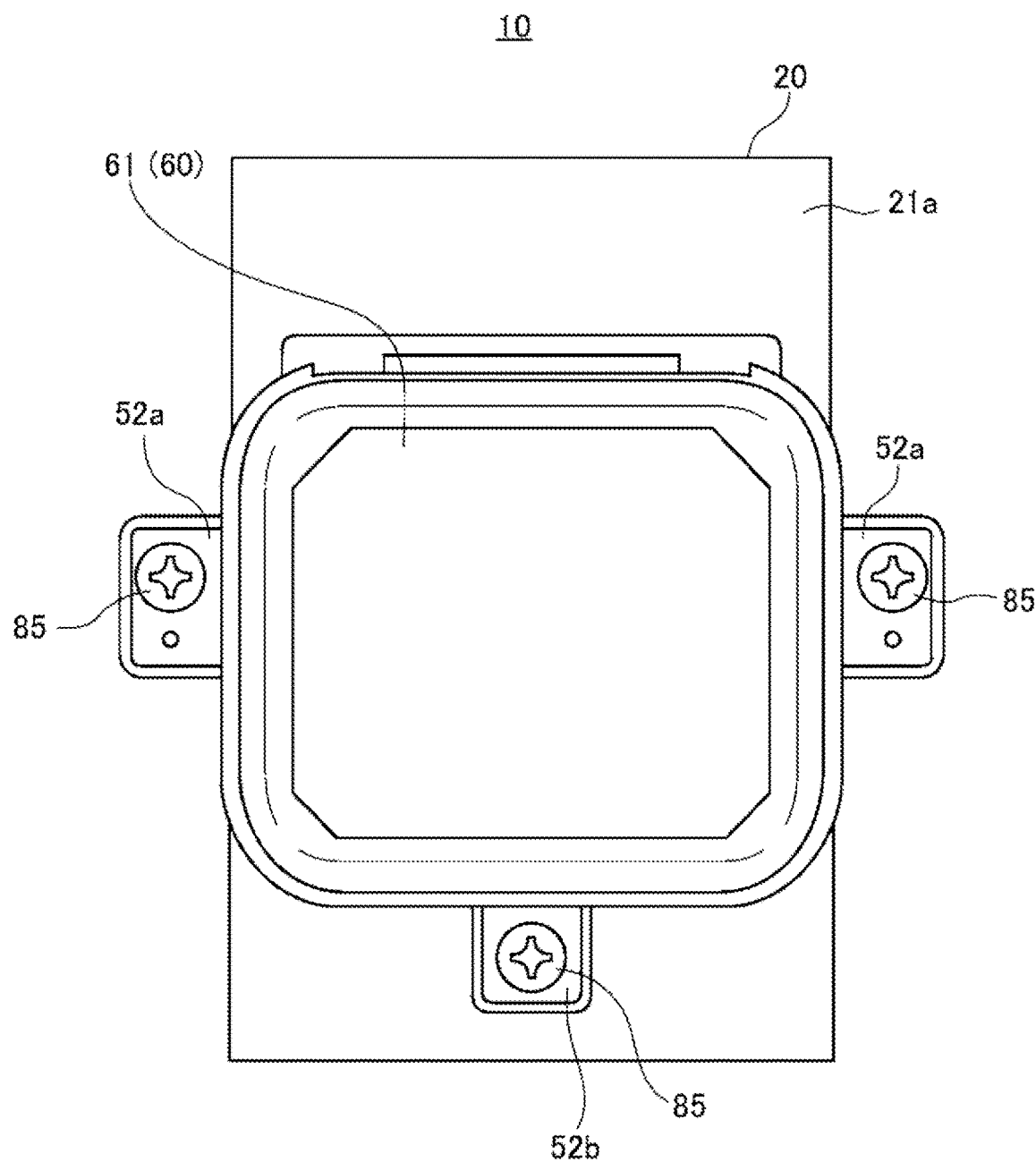

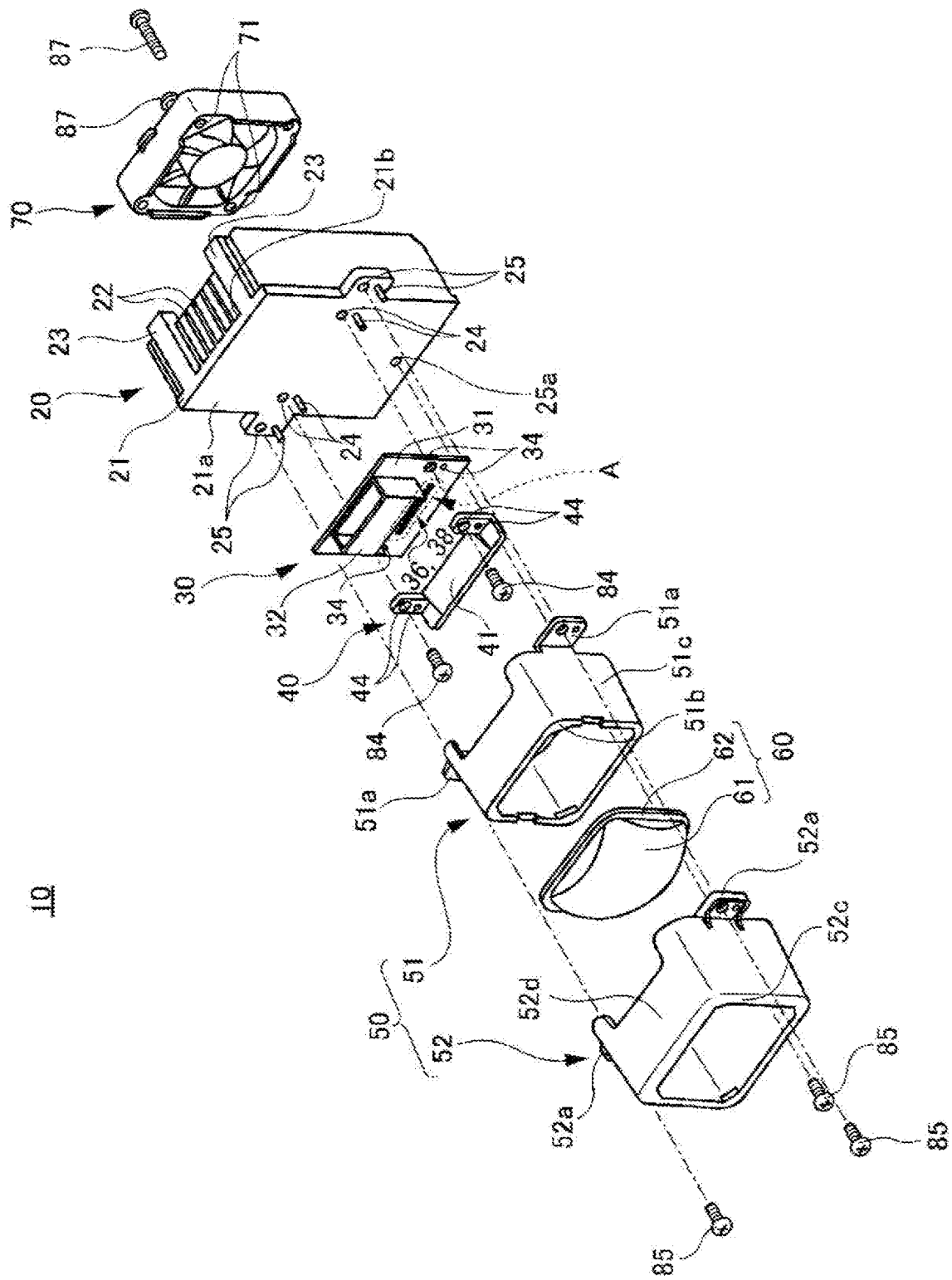
[FIG. 3]

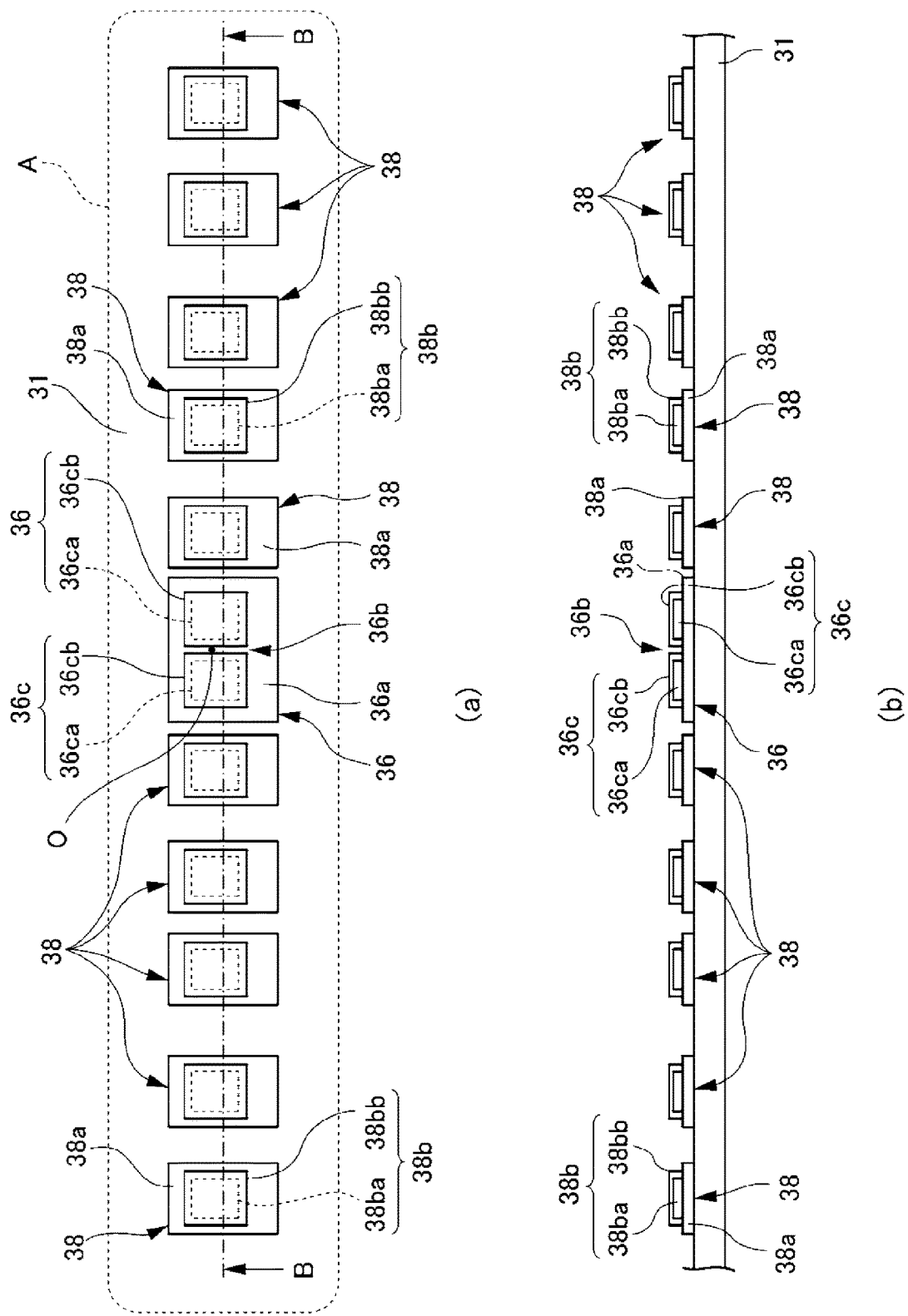
[FIG. 4]

[FIG. 5]
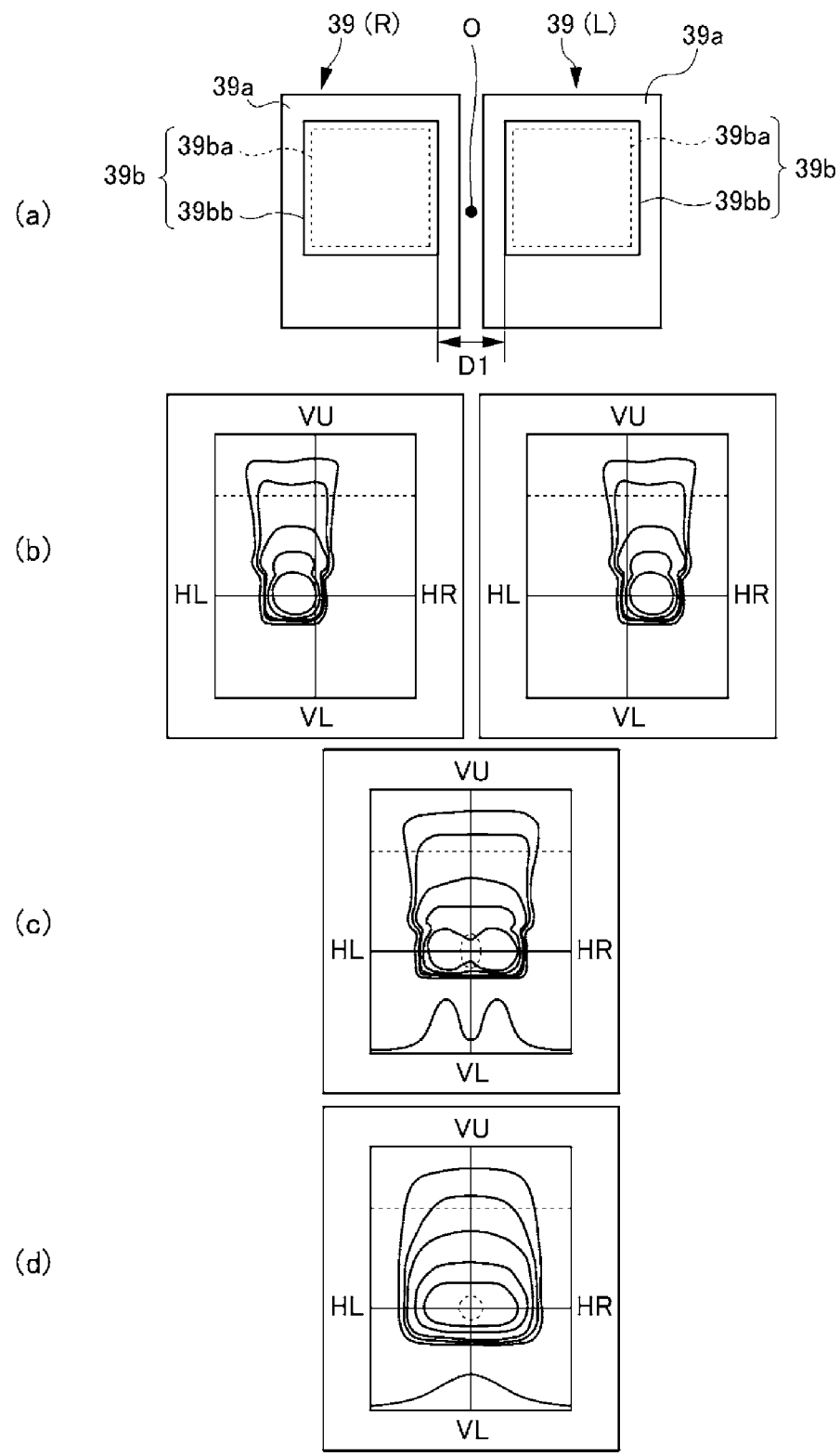

[FIG. 6]
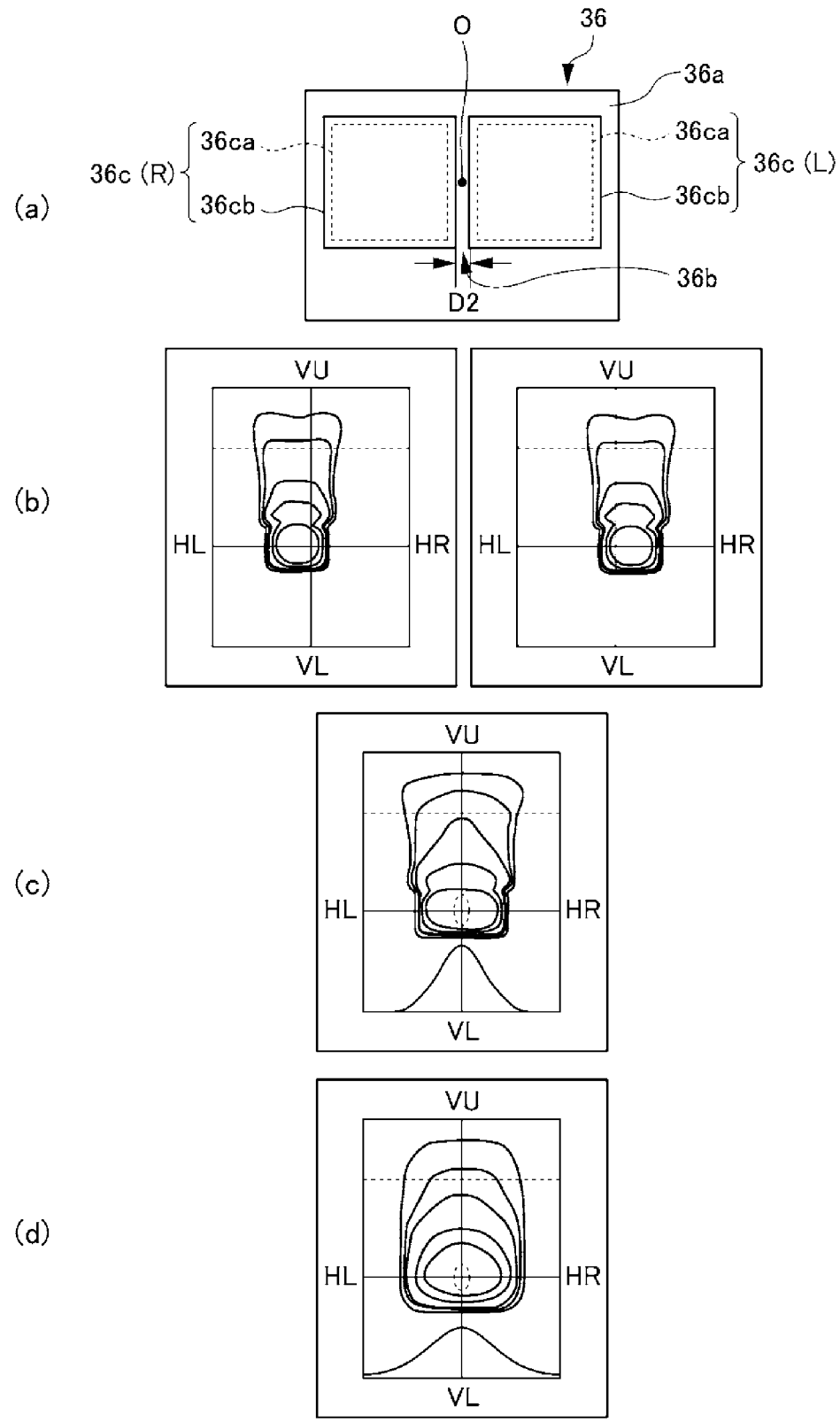

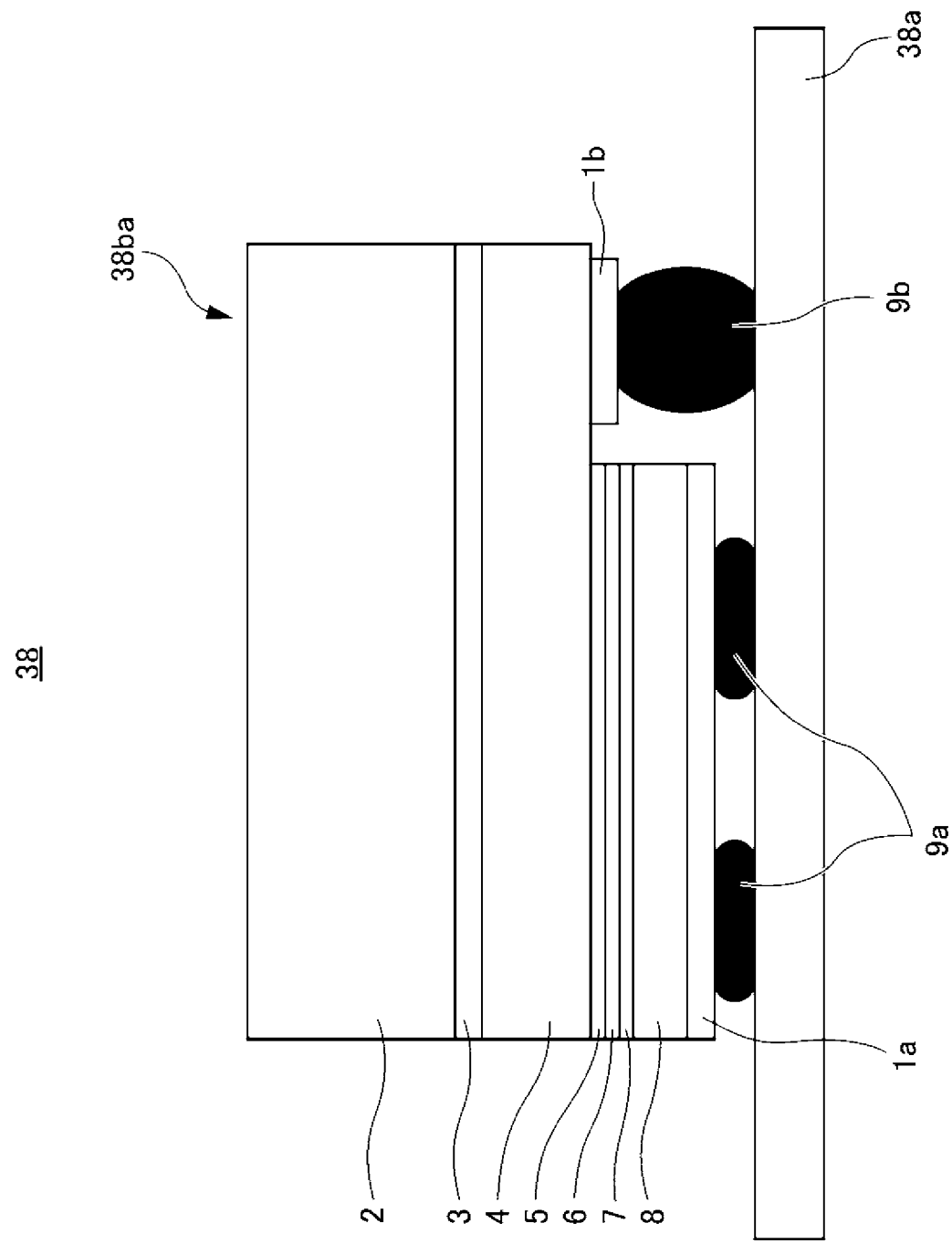

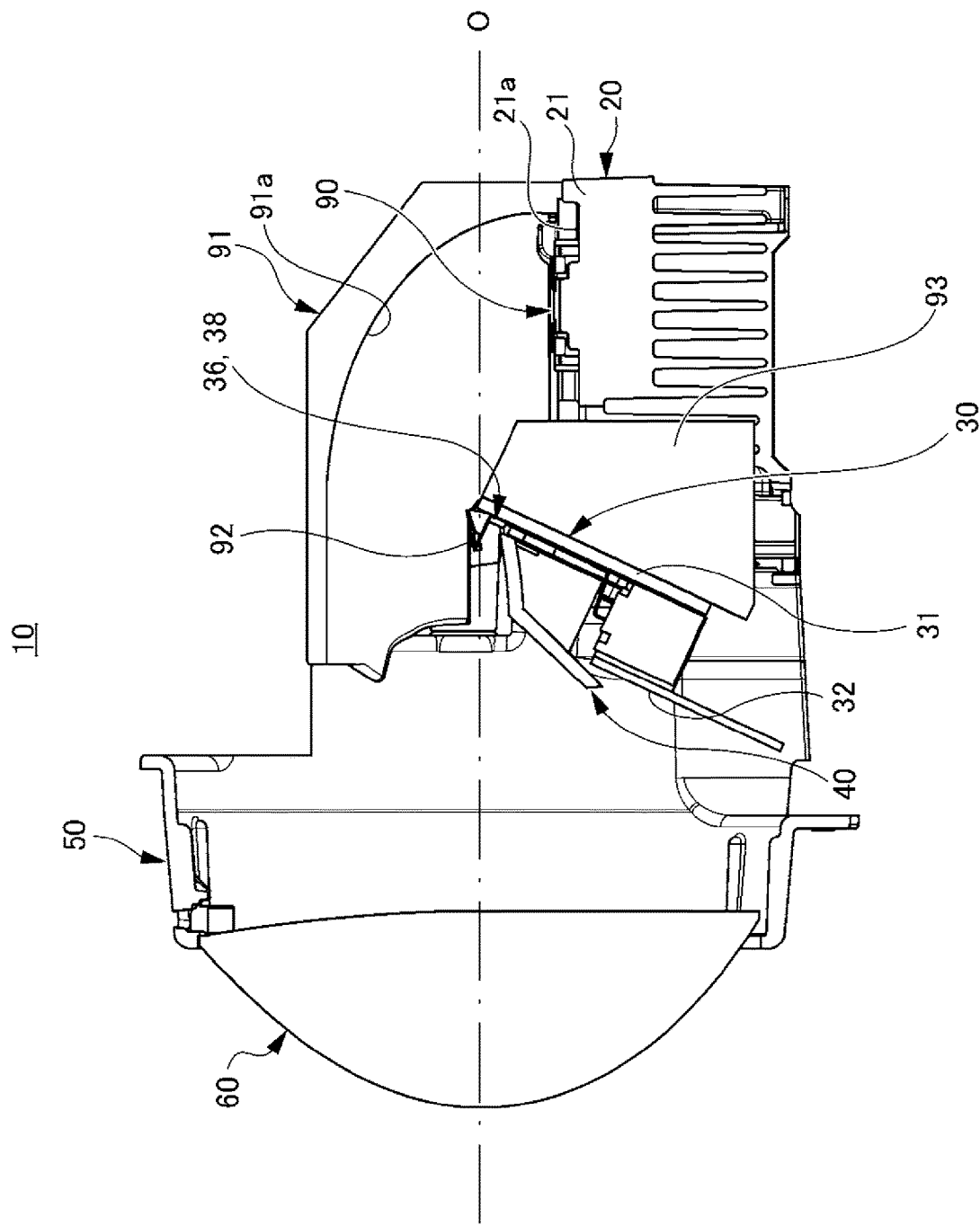
[FIG. 8]

[FIG. 9]
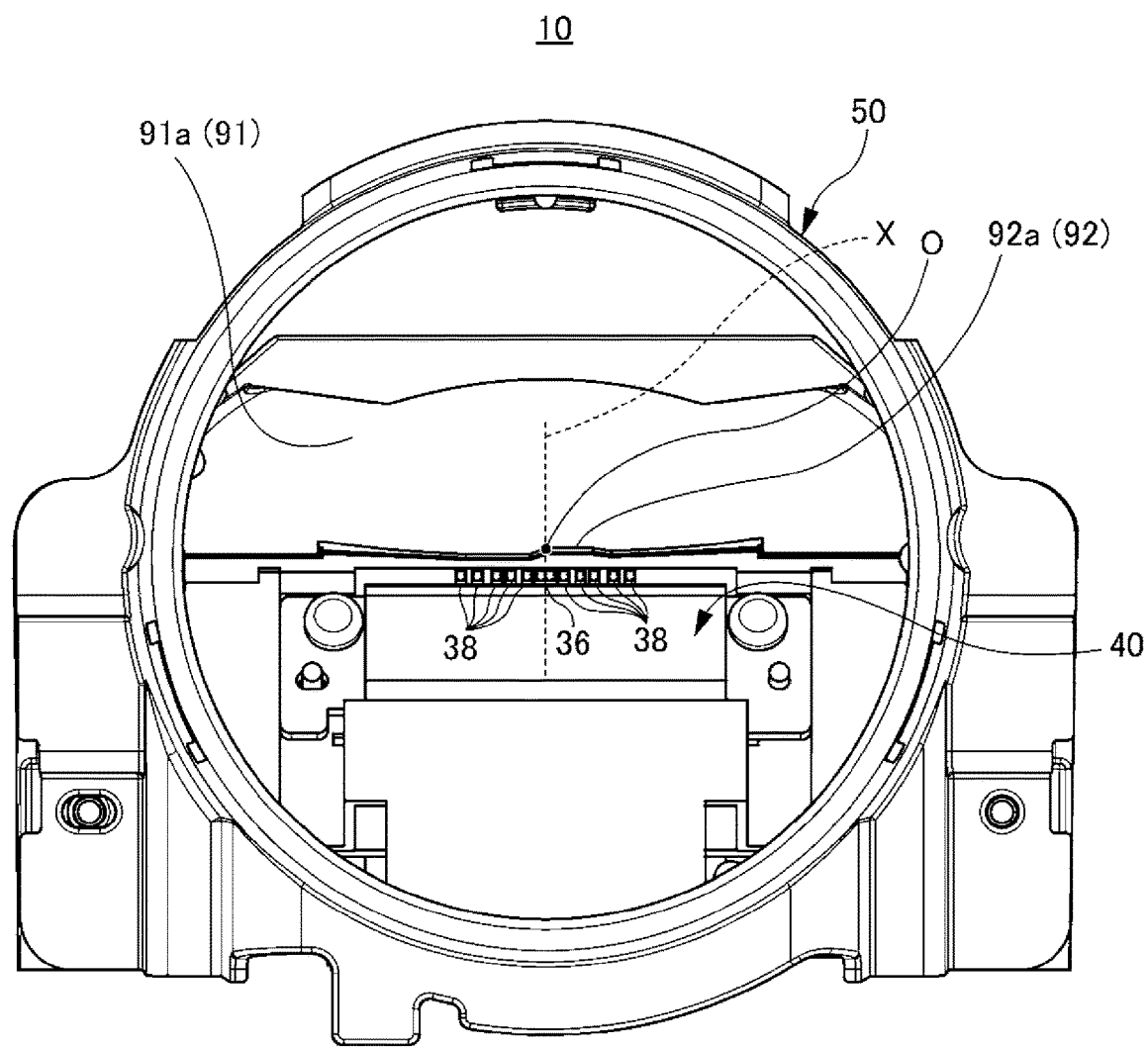

LIGHTING FIXTURE FOR VEHICLE

TECHNICAL FIELD

The present invention relates to a vehicular lamp.

BACKGROUND ART

In a vehicular front light capable of controlling an adaptive driving beam that varies a driving-beam light distribution pattern, a light source that forms a central portion of the light distribution pattern is turned off in response to detection of the presence of another vehicle, such as a leading vehicle, and forms a driving-beam light distribution pattern that is substantially equally divided into two in the left-right direction, which may give a driver an uncomfortable feeling. Therefore, PTL 1 discloses a vehicular front light that has reduced the above-described discomfort.

CITATION LIST

Patent Literature

PTL 1: Japanese Unexamined Patent Application Publication No. 2013-20709

SUMMARY OF THE INVENTION

Problems to be Solved by the Invention

The light from light emitting units arrayed in the horizontal direction forms individual light distribution patterns overlapping adjacent light distribution patterns at predetermined positions in the horizontal direction on a screen. In ADB control, the light distribution patterns are turned on or off at positions in the horizontal direction corresponding to the position of a leading vehicle or an oncoming vehicle.

A driving-beam light distribution pattern requires a high luminosity region (also referred to as "hot spot") in the central area. In ADB control, the light from the light-emitting units arrayed in the horizontal direction should form individual light distribution patterns on the screen at predetermined position in the horizontal direction, as described above. Thus, the light from the light-emitting units disposed on the outer side in the horizontal direction cannot be controlled to be distributed to the central area of the driving-beam light distribution pattern.

Furthermore, an increase in the number of light-emitting units causes an increase in the cost of parts. Thus, to form a satisfactory driving-beam light distribution pattern with a certain number of light-emitting units, without excessively increasing the number light-emitting units, the light distribution patterns formed on a screen by the light from the light-emitting units arrayed in the horizontal direction should appropriately overlap.

In this way, vehicular lamps under ADB control has room for improvement in the formation of more desirable driving-beam light distribution patterns in consideration of the cost of parts.

The present invention has been made in view of these circumstances, and an object thereof is to provide a vehicular lamp that can form a driving-beam light distribution pattern more desirable than that formed by a vehicular lamp under ADB control.

Means for Solving the Problem

In order to achieve the above object, the present invention is realized by the following constitution.

(1) A vehicular lamp according to the present invention comprising: a semiconductor light source; and a lens disposed in front of the light source, wherein, the light source comprises: a substrate; a first light-emitting unit comprising a first base substrate disposed on the substrate; and a plurality of second light-emitting units each comprising a second base substrate disposed on the substrate, the second light-emitting units disposed on left and right outer sides of the first light-emitting unit in a horizontal direction, the first light-emitting unit comprises two first light-emitting chip units disposed on the first base substrate across in a first gap in the horizontal direction, the second light-emitting units each comprises a second light-emitting chip unit comprising one second light-emitting chip covered with a phosphor, the second light-emitting chip being mounted on the second base substrate while a light-emitting layer of the second light-emitting chip is disposed adjacent to the second base substrate, the two first light-emitting chip units each comprises: one first light-emitting chip mounted on the first base substrate; and a phosphor covering the first light-emitting chip, the first light-emitting unit is disposed on the substrate such that the first gap is positioned on or near a vertical axis extending through a lens optical axis of the lens, and the first gap has a width in the horizontal direction smaller than the width of a gap between the first light-emitting unit and one of the second light-emitting units adjacent to the first light-emitting unit in the horizontal direction.

(2) A vehicular lamp according to the present invention comprising: a semiconductor light source; and a lens disposed in front of the light source, wherein, the light source comprises: a substrate; a first light-emitting unit comprising a first base substrate disposed on the substrate; and a plurality of second light-emitting units each comprising a second base substrate disposed on the substrate, the second light-emitting units disposed on left and right outer sides of the first light-emitting unit in a horizontal direction, the first light-emitting unit comprises a first light-emitting chip unit disposed on the first base substrate, the second light-emitting units each comprises a second light-emitting chip unit comprising one second light-emitting chip covered with a phosphor, the second light-emitting chip being mounted on the second base substrate while a light-emitting layer of the second light-emitting chip is disposed adjacent to the second base substrate, the first light-emitting chip unit comprises: two first light-emitting chips mounted on the first base substrate apart from each other in a horizontal direction; and a phosphor covering the two first light-emitting chips, the first light-emitting unit is disposed on the substrate such that a gap between the first light-emitting chips is positioned on or near a vertical axis extending through a lens optical axis of the lens, and the gap between the first light-emitting chips has a width in the horizontal direction smaller than the width in the horizontal direction of a gap between the first light-emitting unit and the second light-emitting unit adjacent to the first light-emitting unit.

(3) The vehicular lamp according to the (1) or (2), wherein the first light-emitting chips are mounted on the first base substrate such that light-emitting layers of the first light-emitting chips are disposed adjacent to the first base substrate.

(4) The vehicular lamp according to any the (1) to (3), wherein, the first light-emitting unit is electrically connected to the substrate on a rear face remote from a front face on which the first light-emitting chips of the first base substrate are mounted, and the second light-emitting units are each electrically connected to the substrate on a rear face remote from a front face on which the second light-emitting chips of the second base substrates are mounted.

(5) The vehicular lamp according to any the (1) to (4), wherein, electrical power is fed to the first light-emitting chips through a common line, and the first light-emitting chips are simultaneously turned off.

(6) The vehicular lamp according to any the (1) to (5), wherein the thicknesses of the first base substrate and the second base substrates gradually differ from the first base substrate toward left and right outer sides in the horizontal direction.

(7) The vehicular lamp according to the (6), wherein the thicknesses are smallest at the left and right outermost sides in the horizontal direction.

(8) A vehicular lamp according to the present invention comprising: a semiconductor light source; and a lens disposed in front of the light source, wherein, the light source comprises: a substrate; a first light-emitting unit comprising a first base substrate disposed on the substrate and disposed on or near a vertical axis extending through a lens optical axis of the lens; and a plurality of second light-emitting units each comprising a second base substrate disposed on the substrate and disposed on left and right outer sides of the first light-emitting unit in a horizontal direction, the first light-emitting unit comprises a first light-emitting chip unit comprising a first light-emitting chip mounted on the first base substrate, the second light-emitting units each comprises a second light-emitting chip unit comprising a second light-emitting chip mounted on the second base substrate, and the thicknesses of the first base substrate and the second base substrates gradually differ from the first base substrate toward left and right outer sides in the horizontal direction.

(9) The vehicular lamp according to the (8), wherein the thicknesses are smallest at the left and right outermost sides in the horizontal direction.

Effect of the Invention

The present invention can provide a vehicular lamp that can form a driving-beam light distribution pattern more desirable than that formed by a vehicular lamp under ADB control, with consideration of cost of parts.

BRIEF DESCRIPTION OF THE DRAWINGS

FIG. 1 is a plan view of a vehicle including a vehicular lamp according to a first embodiment of the present invention.

FIG. 2 is a plan view of a lamp unit according to the first embodiment of the present invention viewed from the front.

FIG. 3 is an exploded perspective view of the lamp unit according to the first embodiment of the present invention.

FIG. 4 is a partially enlarged view of the area within the dotted-line frame A of FIG. 3, in which (a) is a plan view from the front and (b) is a cross-sectional view taken along line B-B of (a).

FIG. 5 is a comparative view of the first embodiment of the present invention, in which (a) is a plan view of two light-emitting units having the same configuration as that of a second light-emitting unit disposed close to each other to form a high luminosity region; (b) is a diagram illustrating light distribution patterns formed on a screen by light-emitting units via a lens without a fine light diffusion structure; (c) is a diagram illustrating a light distribution pattern formed on a screen by multiplexing the light distribution patterns in (b); and (d) is a diagram of the light distribution pattern of (c) projected on a screen via a lens having a fine light diffusion structure.

FIG. 6 illustrates a high luminosity region formed by light from a first light-emitting unit according to the first embodiment of the present invention, in which (a) is a plan view of the first light-emitting unit; (b) is a diagram illustrating light distribution patterns formed on a screen by each of first light emitting chip units of a first light-emitting unit via a lens without a fine light diffusion structure; (c) is a diagram illustrating a light distribution pattern formed on a screen by multiplexing the light distribution patterns in (b); and (d) is a diagram of the light distribution pattern of (c) projected on a screen via a lens having a fine light diffusion structure.

FIG. 7 is a cross-sectional view of one of the second light-emitting units according to the first embodiment of the present invention.

FIG. 8 is a cross-sectional view of a lamp unit according to a second embodiment of the present invention.

FIG. 9 is a plan view of the lamp unit according to the second embodiment of the present invention viewed from the front.

MODE FOR CARRYING OUT THE INVENTION

Hereinafter, modes for carrying out the present invention (hereinafter, referred to as "embodiments") will be described in detail with reference to the accompanying drawings. Like elements throughout the entire description of the embodiments will be denoted by like numerals. Also, unless otherwise noted, in the embodiments and drawings, "front" and "rear" indicate a "forward direction" and a "reverse direction," respectively, of the vehicle, and "upper," "lower," left," and "right" all indicate directions from the viewpoint of a driver riding in the vehicle. A vehicular lamp according to the embodiment of the present invention is one of vehicular front lights (101R, 101L) provided on the left and right sides, respectively, at the front of a vehicle 102 illustrated in FIG. 1, which will hereinafter simply be referred to as a vehicular lamp.

First Embodiment

The vehicular lamp according to the present embodiment includes a housing (not illustrated) opened to the front of the vehicle and an outer lens (not illustrated) attached to the housing so as to cover the opening. A lamp unit 10 (see FIG. 2) and other components are arranged in a lamp chamber defined by the housing and the outer lens. Note that, in the description on the lamp unit 10 below, the lamp unit 10 has the same configuration for both the left and right vehicular lamps, unless otherwise noted.

(Lamp Unit)

FIG. 2 is a plan view of the lamp unit 10 in view from the front. FIG. 3 is an exploded perspective view of the lamp unit 10. The lamp unit 10 includes a light source 30 (see FIG. 3) including multiple light-emitting units (a first light-emitting unit 36 and second light-emitting units 38 (see FIG. 4)) arrayed in the horizontal direction, as described below. The lamp unit 10 is a variable light distribution type driving-light distribution unit that can carry out so-called adaptive driving beam (ADB) control by turning on or off some or all of the light-emitting units (the first light-emitting unit 36 and the second light-emitting units 38) depending on the positional relation with a leading vehicle or an oncoming vehicle.

Specifically, as illustrated in FIG. 3, the lamp unit 10 includes a heat sink 20, a light source 30, a reflective board 40, a lens holder 50, a lens 60, and a cooling fan 70.

(Heat Sink)

The heat sink 20 includes a base portion 21, heat radiating fins 22, and cooling fan mounts 23.

The front face 21a of the base portion 21 constitutes a light-source mount on which the light source 30 is mounted. The rear face 21b of the base portion 21 remote from the front face 21a is provided with the heat radiating fins 22 arrayed in the horizontal direction such that the heat radiating fins 22 extend rearward from the rear face 21b.

The cooling fan mounts 23 on which the cooling fan 70 is mounted are disposed on the left and right outer sides of the rear face 21b in the horizontal direction such that the cooling fan mounts 23 extend rearward from the rear face 21b, like the heat radiating fins 22.

A pair of left and right fixing structures 24 for fixing the light source 30 and the reflective board 40 is disposed at the substantial center in the vertical direction on the front face 21a of the base portion 21. In specific, the fixing structures 24 each includes a boss for alignment of the light source 30 and the reflective board 40 and a screw fixing hole into which a screw 84 is screwed for fixture.

Note that a substrate 31 of the light source 30 has through-holes 34 corresponding to the fixing structures 24 at the outer sides on the left and right in the horizontal direction slightly below the substantial center in the vertical direction. Similarly, the reflective board 40 has two arm portions provided on the outer side on the left and right in the horizontal direction provided with through-holes 44 corresponding to the fixing structures 24.

Thus, the light source 30 and the reflective board 40 are fastened together to the base portion 21 with screws 84.

The base portion 21 has tabs protruding outward from the left and right outer sides at the substantial center in the vertical direction. The tabs are provided with left and right fixing structures 25 for attachment of the lens holder 50.

In specific, the fixing structures 25 each include a boss for alignment of the lens holder 50 and a screw fixing hole into which a screw 85 is screwed for fixture. Note that the base portion 21 has a screw fixing hole 25a into which the screw 85 is screwed at a position vertically downward from the substantial center in the horizontal direction. Thus, the lens holder 50 is fixed to the base portion 21 with three screws 85.

As described below, the lens holder 50 includes a first lens holder 51 and a second lens holder 52. The first lens holder 51 has hole portions 51a having through-holes corresponding to the fixing structures 25 disposed on the outer left and right sides of the first lens holder 51 in the horizontal direction. The second lens holder 52 also has hole portions 52a having through-holes corresponding to the fixing structures 25 disposed on the outer left and right sides of the second lens holder 52 in the horizontal direction.

The second lens holder 52 also has a hole portion 52b (see FIG. 2) at a position vertically downward from the substantial center in the horizontal direction, the hole portion 52b having a through-hole corresponding to the screw fixing hole 25a in the base portion 21. The first lens holder 51 also has a hole portion having a through-hole corresponding to the screw fixing hole 25a in the base portion 21 at a position in alignment with the hole portion 52b in front view. Thus, the first lens holder 51 and the second lens holder 52 are fastened together to the base portion 21 with screws 85.

As illustrated in FIG. 3, the cooling fan mounts 23 also have screw fixing holes (not illustrated) into which screws 87 are screwed to fix the cooling fan 70. The screws 87 pass through screw holes 71 in the cooling fan 70 and are screwed into screw fitting holes (not illustrated) in the cooling fan mounts 23, to fix the cooling fan 70 to the heat sink 20.

(Cooling Fan)

The cooling fan 70 is a component that generates wind for forced cooling the heat radiating fins 22. Although the cooling fan 70 is not mandatory, it is preferred that the cooling fan 70 be provided because the light-emitting units (the first light-emitting unit 36 and the second light-emitting units 38 (see FIG. 4)) of the light source 30 according to this embodiment generate a large amount of heat, as described below.

(Reflective Board)

As illustrated in FIG. 3, the reflective board 40 is a component having a bottom face constituting a reflective face 41 supported by two arm portions on the left and right in the horizontal direction.

The reflective face 41 is disposed at a position immediately below and close to the light-emitting units (the first light-emitting unit 36 and the second light-emitting units 38 (see FIG. 4)) of the light source 30, as described below. The reflective face 41 is a component that serves to enlarge, in the vertical direction, the image of light from the light emitting chips (light emitting chips 36ca and light emitting chips 38ba (see FIG. 4)) of the light-emitting units (the first light-emitting unit 36 and the second light-emitting units 38).

By enlarging the image of light in the vertical direction by the reflective board 40 in this way, a range in the vertical direction required for a driving-beam light distribution pattern can be irradiated with light, even when the light-emitting units (the first light-emitting unit 36 and the second light-emitting units 38) disposed along the horizontal direction are provided in only one row.

(Lens)

As illustrated in FIG. 3, the lens 60 includes a lens portion 61 having a rectangular shape in the front view and a flange portion 62 that is to be held by the lens holder 50 and disposed on the outer circumference of the lens portion 61.

The lens portion 61 controls the distribution of light from the light-emitting chips (the first light-emitting chips 36ca and the second light-emitting chips 38ba (see FIG. 4)) of the light-emitting units (the first light-emitting unit 36 and the second light-emitting units 38 (see FIG. 4)) of the light source 30, described below, and emits the light forward to form a predetermined light distribution pattern.

In specific, the lens portion 61 has a freeform surface formed such that both the incident face and the emission face protrude, light from the light-emitting chips (the first light-emitting chips 36ca and the second light-emitting chips 38ba (see FIG. 4)) being incident on the incident face, the incident light being emitted from the emission. The incident face and the emission face are formed to have surface shapes that enable predetermined light distribution control.

The lens 60 can be desirably composed of a polycarbonate resin or an acrylic resin. However, when the light-emitting units (the first light-emitting unit 36 and the second light-emitting units 38 (see FIG. 4)) generate excess heat, a polycarbonate resin is desirable for its excellent heat resistance, whereas when the generation of a blue spectrum in the light distribution pattern is to be prevented, an acrylic resin is desirable for its low wavelength dependency of the refractive index and capability of readily suppressing dispersion of light.

Note that, although not illustrated, the incident face of the lens portion 61 according to this embodiment has protrusive fine light diffusing structures (more specifically, fine light diffusing structures having a horizontally long semi-cylindrical shape) extending in the horizontal direction and continuously disposed along the vertical direction.

In this way, the light from the light-emitting chips (the first light-emitting chips 36ca and the second light-emitting chips 38ba (see FIG. 4)) diffuses in the top-bottom direction when entering the incident face into the lens portion 61, thereby blurring the light distribution pattern in the top-bottom direction.

Although not illustrated, the emission face of the lens portion 61 according to this embodiment has protrusive fine light diffusing structures (more specifically, fine light diffusing structures having a vertically long semi-cylindrical shape) extending in the vertical direction and continuously disposed along the horizontal direction.

In this way, the light emitted from the emission face diffuses in the left-right direction, thereby blurring the light distribution pattern in the left-right direction. Thus, the light distribution patterns formed on a screen by light from the light-emitting chips (the first light-emitting chips 36ca and the second light-emitting chips 38ba) can appropriately overlap.

Note that by providing a fine light diffusing structure and thereby blurring the light distribution patterns, as described above, generation of lines due to differences in luminosity can be suppressed at the borders where the light distribution patterns overlap. Furthermore, the protrusive fine light diffusing structures on the incident face and the emission face cross each other in the front view of the lens portion 61, which is equivalent to a meshed fine light diffusing structure. This lowers the visibility of the inner state through the lens 60. Thus, the structure inward of the lens 60 is prevented from being readily visible from the outside, and thereby achieving an advantageous effect of improving the appearance.

(Lens Holder)

As illustrated in FIG. 3, the lens holder 50 includes a first lens holder 51 disposed adjacent to the heat sink 20 and a second lens holder 52 disposed in front of the first lens holder 51.

The first lens holder 51 includes an opening edge portion 51b receiving the flange portion 62 of the lens 60 and an outer circumferential portion 51c extending from the opening edge portion 51b toward the heat sink 20. Note that the hole portions 51a described above extend from the edge of the outer circumferential portion 51c adjacent to the heat sink 20 outward to the left and right sides in the horizontal direction.

The width of the outer circumferential portion 51c in the direction toward the heat sink 20 is set such that the lens 60 is disposed at a predetermined distance from the light source 30 when the first lens holder 51 is fixed to the heat sink 20.

The second lens holder 52 has an opening edge portion 52c having an inner opening shape substantially identical to the external shape of the lens portion 61 of the lens 60 and an outer circumferential portion 52d covering the outer circumferential portion 51c of the first lens holder 51 in the direction from the opening edge portion 52c toward the heat sink 20. Note that the hole portions 52a described above extend from the edge of the outer circumferential portion 52d adjacent to the heat sink 20 outward to the left and right sides in the horizontal direction, and the hole portions 52b extend from the edge of the outer circumferential portion 52d adjacent to the heat sink 20 downward in the vertical direction.

The lens 60 is held by the lens holder 50 by disposing the flange portion 62 of the lens 60 between the opening edge portion 51b of the first lens holder 51 and the opening edge portion 52c of the second lens holder 52.

(Light Source)

The light source 30 includes a substrate 31, light-emitting units (a first light-emitting unit 36 and second light-emitting units 38 (see FIG. 4)) disposed on the substrate 31 as described below, and an electrical connector 32 electrically connected to the light-emitting units (the first light-emitting unit 36 and the second light-emitting units 38) via conductive patterns formed on the substrate 31.

FIG. 4 is a partially enlarged view of the area within the dotted-line frame A of FIG. 3, in which FIG. 4(a) is a plan view from the front and FIG. 4(b) is a cross-sectional view taken along line B-B of FIG. 4(a). Note that, in FIG. 4(a), the left-right direction is the horizontal direction, and the top-bottom direction is the vertical direction. In FIG. 4(b), the left-right direction is the horizontal direction, and the top-bottom direction is the front-rear direction (the top side corresponds to the front side, and the bottom side corresponds to the rear side).

As illustrated in FIG. 4, more specifically, the light source 30 includes a substrate 31, a first light-emitting unit 36 including a first base substrate 36a disposed on the substrate 31, and multiple second light-emitting units 38 disposed on left and right outer sides of the first light-emitting unit in a horizontal direction and including second base substrates 38a disposed on the substrate 31.

Note that in this embodiment, five second light-emitting units 38 are disposed on the left outer side of the first light-emitting unit 36 in the horizontal direction, and five second light-emitting units 38 are disposed on the right outer side of the first light-emitting unit 36 in the horizontal direction. Alternatively, the second light-emitting units 38 disposed on the left and right sides of the first light-emitting unit 36 in the horizontal direction may be different numbers.

For example, for a right vehicular lamp, the number of second light-emitting units 38 on the left side of the first light-emitting unit 36 in the horizontal direction may be increased to widen the range of light distribution toward the outer right side of the vehicle. In contrast, for the left vehicular lamp, the number of second light-emitting units 38 on the right side of the first light-emitting unit 36 in the horizontal direction may be increased to widen the range of light distribution toward the outer left side of the vehicle. Note that, the left side of the right vehicular lamp in the horizontal direction is the inner side of the vehicle, and similarly the right side of the left vehicular lamp in the horizontal direction is the inner side of the vehicle. Thus, a lamp unit 10 that can be disposed on either the left or right side of the vehicle can have a widened range of light distribution on the outer side of the vehicle by providing a larger number of second light-emitting units 38 on the side of the first light-emitting unit 36 corresponding to the inner side of the vehicle than the number of second light-emitting units 38 provided on the other side of the first light-emitting unit 36 corresponding to the outer side of the vehicle.

The first light-emitting unit 36 includes two first light-emitting chip units 36c disposed on a first base substrate 36a adjacent to each other across a first gap 36b in the horizontal direction. The two first light-emitting chip units 36c each includes one first light-emitting chip 36ca mounted on the first base substrate 36a and a phosphor 36cb covering the first light-emitting chip 36ca.

The second light-emitting units 38 each includes a second light-emitting chip unit 38b including one second light-emitting chip 38*ba* mounted on a second base substrate 38*a* and a phosphor 38*bb* covering the second light-emitting chip 38*ba*. The first light-emitting unit 36 is electrically connected to a conductive pattern connected to the electrical connector 32 of the substrate 31 on the rear face of the first base substrate 36*a*, which is the back side of the front face of the first base substrate 36*a* on which the first light-emitting chips 36*ca* of the first base substrate 36*a* are provided. The second light-emitting units 38 are also electrically connected to conductive patterns connected to the electrical connectors 32 of the substrate 31 on the rear faces of the second base substrate 38*a*, which is the back side of the front face of the second base substrate 38*a* on which the second light-emitting chips 38*ba* of the second base substrates 38*a* are provided. Thus, the first base substrate 36*a* and the second base substrates 38*a* have through-holes or via-holes for electrically connecting the front face and the rear face.

Note that, in this embodiment, the light source 30 is a semiconductor light source that uses LED chips as the first light-emitting chip 36*ca* and the second light-emitting chips 38*ba*. However, the first light-emitting chip 36*ca* and the second light-emitting chips 38*ba* should not be limited to LED chips and alternatively may be semiconductor light-emitting chips, such as (laser diode) LD chips.

As illustrated in FIG. 4(*a*), the first light-emitting unit 36 is disposed on the substrate 31 such that the first gap 36*b* is positioned on the lens optical axis O of the lens 60. Thus, the first light-emitting unit 36 can be disposed on or near the rear focal point of the lens 60. However, when many light-emitting units (the first light-emitting unit 36 and the second light-emitting units 38) are arrayed in the horizontal direction on the substrate 31, the second light-emitting units 38 disposed on the outermost sides in the horizontal direction are disposed farthest from the rear focal point.

Thus, the light distribution patterns formed on a screen by the light from the second light-emitting units 38 on the outer sides in the horizontal direction are diffused. As a result, these light distribution patterns tend to overlap the light distribution patterns formed on the screen by the light from the adjacent second light-emitting units 38. Thus, the light distribution patterns can overlap each other without disconnection of the light distribution patterns even when the adjacent second light-emitting units 38 are disposed at large intervals.

Thus, the second light-emitting units 38 disposed on the outer left and right sides in the horizontal direction can be disposed with large intervals between the adjacent second light-emitting units 38 to cover the entire range in the horizontal direction required by a driving-beam light distribution pattern, to reduce the total number of the first light-emitting unit 36 and the second light-emitting units 38, thereby reducing the cost of parts of the light source 30.

The second light-emitting units 38 positioned at the outermost left and right sides in the horizontal direction form the outermost light distribution portions of the driving-beam light distribution pattern in the horizontal direction. However, the second light-emitting units 38 disposed at the outermost left and right sides in the horizontal direction are disposed farthest from the rear focal point of the lens 60. Thus, the light distribution patterns formed by these second light-emitting units 38 are blurry and are desirable for a driving-beam light distribution pattern.

However, the description above is only relevant when the first light-emitting unit 36 is disposed at a desirable position and when the positions of the second light-emitting units 38 can only be adjusted along the horizontal direction with reference to the first light-emitting unit 36. Thus, the design is not highly flexible for forming more desirable light distribution patterns.

Thus, in this embodiment, the first light-emitting unit 36 includes the first base substrate 36*a* and the second light-emitting units 38 include the second base substrates 38*a* such that the first light-emitting unit 36 and the second light-emitting units 38 are disposed on the substrate 31 via these base substrates (the first base substrate 36*a* and the second base substrates 38*a*).

In this way, the thicknesses of the first base substrate 36*a* and the second base substrates 38*a* can be varied to adjust the light-emitting chip units (the first light-emitting chip units 36*c* and the second light-emitting chip units 38*b*) to approach the lens 60 or to adjust the light-emitting chip units to move away from the lens 60.

For example, the second base substrates 38*a* of the second light-emitting units 38 on the outermost left and right sides in the horizontal direction can have a larger thickness such that the second light-emitting chip units 38*b* approach the lens 60. This enables adjustment of the light distribution patterns formed on the screen to have slightly smaller sizes, thereby suppressing uneven light distribution due to off-axis aberration.

In contrast, the second base substrates 38*a* of the second light-emitting units 38 on the outermost left and right sides in the horizontal direction can have a smaller thickness such that the second light-emitting chip units 38*b* are disposed far away from the lens 60. This increases the size of the light distribution patterns formed on the screen, thereby increasing the degree of blurriness.

Thus, such as in this embodiment, in the case where the first light-emitting unit 36 and the second light-emitting units 38 include the first base substrate 36*a* and the second base substrates 38*a*, respectively, not only the positions of the first light-emitting unit 36 and the second light-emitting units 38 in the horizontal direction but also their distances from the lens 60 can be adjusted, thereby increasing the flexibility of design in light distribution.

For example, when a primary concern is to reduce uneven light distribution due to off-axis aberration, the thicknesses of the first base substrate 36*a* and the second base substrates 38*a* should be sequentially increased from the first base substrate 36*a* toward the second base substrates 38*a* on the outermost left and right sides in the horizontal direction.

In contrast, when a primary concern is to reduce the total number of light-emitting units (the first light-emitting unit 36 and the second light-emitting units 38) and make the outermost side of the driving-beam light distribution pattern in the horizontal direction most blurry, the thicknesses of the first base substrate 36*a* and the second base substrates 38*a* should be sequentially decreased from the first base substrate 36*a* toward the second light-emitting units 38 on the outermost left and right sides in the horizontal direction. Such high flexibility in the design of light distribution enables design of light distribution to form a desirable driving-beam light distribution pattern with a total of 10 to 15 light-emitting units (the first light-emitting unit 36 and the second light-emitting units 38).

The driving-beam light distribution pattern requires a high luminosity region (also referred to as a hot spot) having high luminosity in the central area to be formed. However, when base substrates are provided, distances between adjacent light-emitting units disposed in the central area can only be reduced to a certain limit.

In this embodiment, the first light-emitting unit 36 positioned in the central area includes the two first light-emitting chip units 36*c* disposed on the first base substrate 36*a* adjacent to each other across the first gap 36*b* in the horizontal direction, as described above. The two first light-emitting chip units 36*c* are disposed close to each other.

Note that the first gap 36*b* between the first light-emitting chip units 36*c* has a width in the horizontal direction smaller than or equal to one third of the width of the gap between the first light-emitting unit 36 and an adjacent second light-emitting unit 38 in the horizontal direction.

Similarly, the width of the gap between adjacent first light-emitting chips 36*ca* in the horizontal direction can be set to a width substantially the same as the width of the first gap 36*b*. Thus, the width of the gap between adjacent first light-emitting chips 36*ca* in the horizontal direction is set to a width smaller than or equal to one third of the width of the gap between the first light-emitting unit 36 and the adjacent second light-emitting unit 38 in the horizontal direction.

In this way, high luminosity suitable for the formation of a high luminosity region (hot spot) can be achieved, as described below with reference to FIGS. 5 and 6.

FIG. 5 is a comparative view of the first embodiment of the present invention, in which FIG. 5(*a*) is a plan view of two light-emitting units 39 having the same configuration as that of the second light-emitting unit 38 for forming a high luminosity region disposed close to each other; FIG. 5(*b*) is a diagram illustrating light distribution patterns formed on a screen by the light-emitting units 39 via the lens 60 without a fine light diffusion structure; FIG. 5(*c*) is a diagram illustrating a light distribution pattern formed on a screen by multiplexing the light distribution patterns in FIG. 5(*b*); and FIG. 5(*d*) is a diagram of the light distribution pattern of FIG. 5(*c*) projected on a screen via the lens 60 having a fine light diffusion structure.

The VU-VL lines in FIGS. 5(*b*), 5(*c*), and 5(*d*) each indicates a vertical reference line on the screen, and the HL-HR lines each indicates a horizontal reference line on the screen. This is also the same in the subsequent drawings illustrating light distribution patterns on a screen. FIGS. 5(*b*), 5(*c*), and 5(*d*) each illustrates light distribution patterns in equal luminosity lines. FIGS. 5(*c*) and 5(*d*) illustrate the luminosity distribution along the horizontal reference line (the HL-HR line) below the light distribution patterns represented by the equal luminosity lines. Note that FIG. 5(*a*) is a front plan view and thus the left and right in the drawing are opposite to those in view of the driver in the vehicle.

FIG. 6 illustrates a high luminosity region formed by light from the first light-emitting unit 36 according to the first embodiment, in which FIG. 6(*a*) is a plan view of the first light-emitting unit 36; FIG. 6(*b*) is a diagram illustrating light distribution patterns formed on a screen by the first light-emitting chip units 36*c* of the first light-emitting unit 36 via the lens 60 without a fine light diffusion structure; FIG. 6(*c*) is a diagram illustrating a light distribution pattern formed on a screen by multiplexing the light distribution patterns of FIG. 6(*b*); and FIG. 6(*d*) is a diagram of the light distribution pattern of FIG. 6(*c*) projected on a screen via the lens 60 having a fine light diffusion structure.

Note that FIGS. 6(*b*), 6(*c*), and 6(*d*), similar to FIG. 5, each illustrate light distribution patterns in equal luminosity lines. FIGS. 6(*c*) and 6(*d*) illustrate the luminosity distribution along the horizontal reference line below the light distribution patterns represented by the equal luminosity lines. FIG. 6(*a*), which is similar to FIG. 5(*a*), is a front plan view. Thus, the left and right in the drawing are opposite to the left and right viewed from the driver in the vehicle.

FIG. 5 illustrates a case in which two light-emitting units 39 having the same configuration as that of the second light-emitting units 38 are used for comparison, to form high luminosity regions while the light-emitting units 39 are disposed as close as possible to the lens optical axis O of the lens 60.

Thus, the light-emitting units 39 each include a base substrate 39*a* and a light-emitting chip unit 39*b* disposed on the base substrate 39*a*, like the second light-emitting units 38.

The light-emitting chip unit 39*b* includes one light-emitting chip 39*ba* disposed on the base substrate 39*a* and a phosphor 39*bb* covering the light-emitting chip 39*ba*.

As illustrated in FIG. 5(*a*), when the two light-emitting units 39 are used, the light-emitting chip unit 39*b* of the light-emitting unit 39(L) disposed on the left side in the horizontal direction is disposed at a distance D1 (specifically, approximately 0.7 mm) from the light-emitting chip unit 39*b* of the light-emitting unit 39(R) disposed on the right side in the horizontal direction, due to limitations by the conductive patterns and/or other components on the substrate provided with the light-emitting units 39.

The light distribution patterns formed on the screen by the light from the light-emitting units 39 arranged in this way are illustrated in FIG. 5(*b*). The light distribution pattern on the left of the FIG. 5(*b*) is a light distribution pattern formed by the light from the light-emitting unit 39(R) disposed on the right side in the horizontal direction. The light distribution pattern on the right of the FIG. 5(*b*) is a light distribution pattern formed by the light from the light-emitting unit 39(L) disposed on the left side in the horizontal direction.

As illustrated in FIG. 5(*b*), the light distribution pattern formed by the light from the light-emitting unit 39(R) disposed on the right side in the horizontal direction is mainly disposed on the left side of the vertical reference line (see the VU-VL line) in the horizontal direction.

As illustrated in FIG. 5(*b*), the light distribution pattern formed by the light from the light-emitting unit 39(L) disposed on the left side in the horizontal direction is mainly disposed on the right side of the vertical reference line (see the VU-VL line) in the horizontal direction.

Thus, when the light distribution patterns illustrated in FIG. 5(*b*) are multiplexed, the light distribution pattern illustrated in FIG. 5(*c*) is obtained. As it is apparent from the light distribution pattern illustrated in FIG. 5(*c*), the distance D1 is large between the light-emitting chip unit 39*b* of the light-emitting unit 39(L) disposed on the left side in the horizontal direction and the light-emitting chip unit 39*b* of the light-emitting unit 39(R) disposed on the right side in the horizontal direction, i.e., the light-emitting chip 39*ba* of the light-emitting chip unit 39(L) is disposed at a large distance from the light-emitting chip 39*ba* of the light-emitting unit 39(R). Thus, areas of the light distribution patterns illustrated in FIG. 5(*b*) having the highest luminosity do not sufficiently overlap. Thus, as it is apparent from the light distribution pattern illustrated in FIG. 5(*c*), the areas having high luminosity do not merge in the region disposed on and in the vicinity of the intersection of the vertical reference line (see the VU-VL line) and the horizontal reference line (see the HL-HR line) (see the region indicated by a dotted line in FIG. 5(*c*)). Thus, the luminosity in the region disposed on and in the vicinity of the intersection of the vertical reference line (see the VU-VL line) and the horizontal reference line (see the HL-HR line) cannot be sufficiently increased, as in the luminosity distribution along the horizontal reference line (see the HL-HR line) illustrated in the bottom area of FIG. 5(*c*).

A fine light diffusion structure can be provided on the lens 60 to blur the light distribution pattern with the lens 60 such that the high luminosity region in the area on and in the vicinity of the intersection of the vertical reference line (see the VU-VL line) and the horizontal reference line (see HL-HR line) is not split, as illustrated in FIG. 5(*d*). However, the peak luminosity at the center cannot be sufficiently enhanced.

In contrast, in this embodiment, the positions of the first light-emitting chip units 36*c* (more specifically, the positions of the light-emitting chips 36*ca*) are not limited by the conductive pattern and/or other elements on the substrate 31. Thus, as illustrated in FIG. 6(*a*), the distance D2 between the first light-emitting chip unit 36*c*(L) on the left side in the horizontal direction and the first light-emitting chip unit 36*c*(R) on the right side in the horizontal direction can be set to a significantly small value (specifically, approximately 0.1 mm). That is, the distance between the light-emitting chip 36*ca* of the first light-emitting chip unit 36*c*(L) and the light-emitting chip 36*ca* of the first light-emitting chip unit 36*c*(R) can be small.

Thus, as it is apparent from FIG. 6(*b*), both the light distribution pattern formed by the light from the first light-emitting chip unit 36*c*(R) on the right side in the horizontal direction (see the light distribution pattern on the left in FIG. 6(*b*)) and the light distribution pattern formed by the light from the first light-emitting chip unit 36*c*(L) on the left side in the horizontal direction (see the light distribution pattern on the right in FIG. 6(*b*)) are positioned closer to the vertical reference line (see the VU-VL line) than the light distribution pattern illustrated in FIG. 5(*b*).

Thus, when the light distribution patterns illustrated in FIG. 6(*b*) are multiplexed, the areas having the highest luminosity sufficiently overlap, as it is apparent in the light distribution pattern illustrated in FIG. 6(*c*). Thus, as it is apparent from the light distribution pattern illustrated in FIG. 6(*c*), the areas having high luminosity merge in the region (see the region indicated by a dotted line in FIG. 6(*c*)) disposed on and in the vicinity of the intersection of the vertical reference line (see the VU-VL line) and the horizontal reference line (see the HL-HR line). Thus, the luminosity in the region disposed on and in the vicinity of intersection of the vertical reference line (see the VU-VL line) and the horizontal reference line (see the HL-HR line) cannot be sufficiently increased, as in the luminosity distribution along the horizontal reference line (see the HL-HR line) illustrated in the bottom area of FIG. 6(*c*).

As illustrated in FIG. 6(*d*), a fine light diffusion structure can be provided on the lens 60 such that, even after the light distribution pattern is blurred, peak luminosity (see the luminosity distribution in the bottom section of FIG. 6(*d*)) can still be achieved in the area on and in the vicinity of the intersection of the vertical reference line (see the VU-VL line) and the horizontal reference line (see HL-HR line). According to such a configuration of this embodiment, design of light distribution for achieving appropriate light distribution has high flexibility, and a satisfactory high luminosity region can be acquired.

As in this embodiment, when many light-emitting units (the first light-emitting unit 36 and the second light-emitting units 38) are disposed on the substrate 31, the amount of generated heat increases, and when the light-emitting chips (the first light-emitting chips 36*ca* and the second light-emitting chips 38*ba*) have a high temperature, the efficiency of light emission is reduced. Thus, it is preferred that the first base substrate 36*a* and the second base substrates 38*a* be substrates having high thermal conductivity, such as silicon substrates. Also, as described below, it is preferred that when mounting the first light-emitting chips 36*ca* and the second light-emitting chips 38*ba* on the first base substrate 36*a* and the second base substrates 38*a*, respectively, the light-emitting layers of the first light-emitting chips 36*ca* and the second light-emitting chips 38*ba* be disposed adjacent to the first base substrate 36*a* and the second base substrates 38*a*.

FIG. 7 is a cross-sectional view of one of the second light-emitting units 38. Note that in FIG. 7, the phosphor 38*bb* is omitted. As illustrated in FIG. 7, the second light-emitting chip 38*ba* is electrically connected to a conductive pattern (not illustrated) of the second base substrate 38*a* via a high reflectivity positive electrode 1*a* with solder bumps 9*a* and via a negative electrode 1*b* with a solder bump 9*b*.

The second light-emitting chip 38*ba* is a blue LED chip having a laminated structure in which a sapphire substrate 2, a low-temperature buffer layer 3, an n-type GaN layer 4, a GaInN/GaN superlattice layer 5, a GaInN/GaN multiquantum well active layer 6, a p-AlGaN electron blocking layer 7, and a p-GaN layer 8 are stacked in this order from the layer most remote from the second base substrate 38*a*.

The negative electrode 1*b* is disposed on the n-type GaN layer 4, and the high reflectivity positive electrode 1*a* is disposed on the p-GaN layer 8. Note that in this embodiment, blue LED chips having the same configuration are used as the first light-emitting chip 36*ca* and the second light-emitting chip 38*ba*. In this embodiment, the phosphors 36*cb* of the first light-emitting unit 36 and the phosphors 38*bb* of the second light-emitting units 38 (see FIG. 4) are yttrium aluminum garnet-based phosphors.

Each second light-emitting chip 38*ba* is mounted on the corresponding second base substrate 38*a* such that the light-emitting layer or GaInN/GaN multiquantum well active layer 6 is disposed closer to the second base substrate 38*a* than the sapphire substrate 2.

By positioning the light-emitting layer side of the second light-emitting chip 38*ba* adjacent to the second base substrate 38*a* and mounting the second light-emitting chip 38*ba* on the second base substrate 38*a*, the heat generated at the light-emitting layer and other layers is efficiently transferred through the shortest distance to the second base substrate 38*a*, such as a silicon substrate having high thermal conductivity, via the solder bumps 9*a* having high thermal conductivity.

Note that similar to the second light-emitting units 38, in the first light-emitting unit 36, it is preferred that the first light-emitting chip 36*ca* be mounted on the first base substrate 36*a* such that the light-emitting layer of the first light-emitting chip 36*ca* is disposed closer to the first base substrate 36*a* than the sapphire substrate 2, i.e., such that the light-emitting layer of the first light-emitting chip 36*ca* is adjacent to the first base substrate 36*a*, to achieve high heat radiation.

However, since the first light-emitting unit 36 is provided with two first light-emitting chips 36*ca*, to turn off these first light-emitting chips 36*ca* separately, the high reflectivity positive electrode 1*a* illustrated in FIG. 7 may be a transparent electrode, such as an ITO electrode, and the first light-emitting chips 36*ca* may be disposed such that the sapphire substrate 2 is adjacent to the first base substrate 36*a*. In such a case, the electrodes of the first light-emitting chips 36*ca* and the conductive pattern of the first base substrate 36*a* should be connected with wire bonding.

In contrast, when the two first light-emitting chips 36*ca* of the first light-emitting unit 36 are to be simultaneously turned on, a conductive pattern that connects the positive electrodes of the two first light-emitting chips 36*ca* and a conductive pattern that connects the negative electrodes of the two first light-emitting chips 36*ca* should be provided on the first base substrate 36a, to feed electrical power to the first light-emitting chips 36ca through common lines.

Second Embodiment

The lamp unit 10 of the first embodiment is a lamp unit for driving-beam light distribution. The vehicular lamp according an embodiment of the present invention, however, is not limited to that including a lamp unit for driving-beam light distribution and alternatively may include a lamp unit 10 that can switch between a driving-beam light distribution pattern and a low-beam light distribution pattern, such as that described in the second embodiment.

FIG. 8 is a cross-sectional view of the lamp unit 10 of a vehicular lamp according to the second embodiment. FIG. 9 is a front plan view of the lamp unit 10 according to the second embodiment. Note that a lens 60 is omitted in FIG. 9. The basic configuration of the lamp unit 10 according to the second embodiment is similar to that according to the first embodiment. Thus, descriptions of components that are the same as those of the first embodiment may be omitted.

As illustrated in FIG. 8, similar to the first embodiment, the lamp unit 10 according to the second embodiment includes a heat sink 20, a light source 30, a reflective board 40, a lens holder 50, and a lens 60. Although not included in this embodiment, the lamp unit 10 according to the second embodiment may include a cooling fan for forced-cooling of the heat sink 20. Note that the lens 60 according to the second embodiment has a circular, not rectangular, external shape in front view.

The heat sink 20 is disposed such that the front face 21a of the base portion 21 faces upward in the vertical direction, unlike the first embodiment in which the heat sink 20 is disposed such that the front face 21a of the base portion 21 faces the front.

The front face 21a of the base portion 21 is provided with a light source 90, not the light source 30, for forming a low-beam light distribution pattern. Note that the light source 90 also includes light-emitting chips (LED chips) similar to the first light-emitting chips 36ca and the second light-emitting chip 38ba described in the first embodiment and phosphors covering the light-emitting chips.

A reflector 91 disposed adjacent to the front face 21a of the base portion 21 covers the light source 90 in a semi-dome shape. The reflector 91 has a reflective face 91a facing the light source 90. The reflective face 91a reflects the light from the light source 90 toward the lens 60.

A shade 92 is disposed between the light source 90 and the lens 60 such that the upper edge 92a (see FIG. 9) is positioned at or near the rear focal point of the lens 60. As illustrated in FIG. 8, the light source 30 for forming a driving-beam light distribution pattern is disposed on a light-source mounting member 93 fixed adjacent to the front side of the heat sink 20. However, the configuration for fixing the light source 30 to the heat sink 20 does not require a light-source mounting member 93 separate from the heat sink 20, and a light-source mounting member may be integrated with the heat sink 20 to fix the light source 30.

Note that, in the second embodiment, the first light-emitting unit 36 and the second light-emitting units 38 of the light source 30 are offset to positions below the lens optical axis O in the vertical direction, as illustrated in FIG. 9, because the shade 92 is disposed at or near the rear focal point of the lens 60. The first light-emitting unit 36 is disposed on the substrate 31 such that the first gap 36b (see FIG. 4) is disposed on or near a vertical axis (see the dotted line X in FIG. 9) extending through the lens optical axis O of the lens 60.

The first gap 36b of the first light-emitting unit 36 of the light source 30 according to the first embodiment is disposed on the lens optical axis O. Thus, the first gap 36b is disposed on or near a vertical axis extending through the lens optical axis O. This configuration of the light source 30 according to the first embodiment is the same as the light source 30 according to the second embodiment. However, in the second embodiment, the first light-emitting unit 36 and the second light-emitting units 38 are offset to positions below the lens optical axis O on the lower side in the vertical direction. Thus, the light source 30 tilts diagonally upward in the vertical direction.

In such a lamp unit 10 according to the second embodiment, a low-beam light distribution pattern is formed by turning off the light source 30 and turning on the light source 90. To switch to a driving-beam light distribution pattern, the light source 90 is turned off and the light source 30 is turned on. Note that, to switch to a driving-beam light distribution pattern, the light source 90 and the light source 30 may both be turned on, without turning off the light source 90.

While forming the driving-beam light distribution pattern, adaptive driving beam (ADB) control is carried out in a manner similar to that of the first embodiment by turning off some or all of the light-emitting units (the first light-emitting unit 36 and the second light-emitting units 38) of the light source 30 in accordance with the position of a leading vehicle or an oncoming vehicle.

In the lens 60 according to the first embodiment, the incident face and the emission face have protrusive fine light diffusing structures. In the case of the lens 60 according to the second embodiment, although the fine light diffusing structures may be provided, the fine light diffusing structures should have a limited structure that considers the use of the lens 60 also for formation of a low-beam light distribution pattern (fine light diffusing structures having low light diffusion). Thus, the light distribution patterns formed by light from the first light-emitting unit 36 and the second light-emitting units 38 of the light source 30 have a lower degree of blurriness in comparison to the first embodiment.

However, as described in the first embodiment, the first light-emitting unit 36 and the second light-emitting units 38 of the light source 30 can blur the light distribution patterns formed by the light from the first light-emitting unit 36 and the second light-emitting units 38 through adjustment of the thickness of the first base substrate 36a and the second base substrates 38a. Thus, a design can be readily provided for appropriately blurring the light distribution patterns, and the design is highly flexible for the formation of an appropriate driving-beam light distribution pattern.

Although the present invention has been described based on specific embodiments, the present invention is not limited to above embodiments. In the first and second embodiments, the first light-emitting unit 36 including the first base substrate 36a disposed on the substrate 31 includes the two first light-emitting chip units 36c disposed on the first base substrate 36 across a first gap 36b in the horizontal direction.

Alternatively, one first light-emitting chip unit 36c may be disposed on the first base substrate 36a, the first light-emitting chip unit 36c including two first light-emitting chips 36ca mounted on the first base substrate 36 across a gap in the horizontal direction and a phosphor covering both of the two first light-emitting chips 36ca.

In such a case, the first gap 36b is not provided but the position of the first light-emitting chips 36ca are the same as in the case where the two first light-emitting chip units 36c are disposed across a first gap 36b.

In the embodiments, for the positional relation described with reference to the first gap 36b, the first gap 36b may be replaced with a gap between the first light-emitting chips 36ca. Thus, the first light-emitting unit 36 may be disposed on the substrate 31 such that the gap between the first light-emitting chips 36ca is positioned on or near a vertical axis extending through the lens optical axis O of the lens 60.

The gap between the first light-emitting chips 36ca is smaller than the width of the gap between the first light-emitting unit 36 and each adjacent second light-emitting unit 38 in the horizontal direction. Thus, even when the phosphor is shared between the two first light-emitting chips 36ca, the advantageous effects according to the embodiments can be achieved.

The present invention is not limited to above embodiment. Modifications and improvements that do not depart from the technical aspects are also included in the technical scope of the invention, and this is evident from the description of the scope of the claims for patent.

DESCRIPTION OF REFERENCE NUMERALS 1a high reflectivity positive electrode
1b negative electrode
2 sapphire substrate
3 low-temperature buffer layer
4 n-type GaN layer
5 gaInN/GaN superlattice layer
6 gaInN/GaN multiquantum well active layer
7 p-AlGaN electron blocking layer
8 p-GaN layer
9a solder bump
9b solder bump
10 lamp unit
20 heat sink
21 base portion
21a front face
21b rear face
22 heat radiating fin
23 cooling fan mount
24 fixing structure
25 fixing structure
25a screw fixing hole
30 light source
31 substrate
32 electrical connector
36 first light-emitting unit
36a first base substrate
36b first gap
36c first light-emitting chip unit
36ca first light-emitting chip
36cb phosphor
38 second light-emitting unit
38a second base substrate
38b second light-emitting chip unit
38bb phosphor
39 light-emitting unit
39a base substrate
39b light-emitting chip unit
39ba light-emitting chip
39bb phosphor
40 reflective board
41 reflective face
44 through-holes
50 lens holder
51 first lens holder
51a hole portions
51b opening edge portion
51c outer circumferential portion
52 second lens holder
52a hole portion
52b hole portion
52c opening edge portion
52d outer circumferential portion
60 lens
61 lens portion
62 flange portion
70 cooling fan
84 screw
85 screw
87 screw
90 light source
91 reflector
91a reflective face
92 shade
92a upper edge
93 light-source mounting member
101L, 101R vehicular front light
102 vehicle

The invention claimed is:

1. A vehicular lamp comprising:
a semiconductor light source; and
a lens disposed in front of the light source, wherein,
the light source comprises:
  a substrate;
  a first light-emitting unit comprising a first base substrate disposed on the substrate; and
  a plurality of second light-emitting units each comprising a second base substrate disposed on the substrate, the second light-emitting units disposed on left and right outer sides of the first light-emitting unit in a horizontal direction,
the first light-emitting unit comprises two first light-emitting chip units disposed on the first base substrate across in a first gap in the horizontal direction,
the second light-emitting units each comprises a second light-emitting chip unit comprising one second light-emitting chip covered with a phosphor, the second light-emitting chip being mounted on the second base substrate while a light-emitting layer of the second light-emitting chip is disposed adjacent to the second base substrate,
the two first light-emitting chip units each comprises:
  one first light-emitting chip mounted on the first base substrate; and
  a phosphor covering the first light-emitting chip,
the first light-emitting unit is disposed on the substrate such that the first gap is positioned on or near a vertical axis extending through a lens optical axis of the lens, and
the first gap has a width in the horizontal direction smaller than the width of a gap between the first light-emitting unit and one of the second light-emitting units adjacent to the first light-emitting unit in the horizontal direction.

2. The vehicular lamp according to claim 1, wherein the thicknesses of the first base substrate and the second base substrates gradually differ from the first base substrate toward left and right outer sides in the horizontal direction.

3. The vehicular lamp according to claim 2, wherein the thicknesses are smallest at the left and right outermost sides in the horizontal direction.

4. The vehicular lamp according to claim 1, wherein,
the first light-emitting unit is electrically connected to the substrate on a rear face remote from a front face on which the first light-emitting chips of the first base substrate are mounted, and
the second light-emitting units are each electrically connected to the substrate on a rear face remote from a front face on which the second light-emitting chips of the second base substrates are mounted.

5. The vehicular lamp according to claim 1, wherein,
electrical power is fed to the first light-emitting chips through a common line, and
the first light-emitting chips are simultaneously turned off.

6. The vehicular lamp according to claim 1, wherein the first light-emitting chips are mounted on the first base substrate such that light-emitting layers of the first light-emitting chips are disposed adjacent to the first base substrate.

7. A vehicular lamp comprising:
a semiconductor light source; and
a lens disposed in front of the light source, wherein,
the light source comprises:
  a substrate;
  a first light-emitting unit comprising a first base substrate disposed on the substrate; and
  a plurality of second light-emitting units each comprising a second base substrate disposed on the substrate, the second light-emitting units disposed on left and right outer sides of the first light-emitting unit in a horizontal direction,
the first light-emitting unit comprises a first light-emitting chip unit disposed on the first base substrate,
the second light-emitting units each comprises a second light-emitting chip unit comprising one second light-emitting chip covered with a phosphor, the second light-emitting chip being mounted on the second base substrate while a light-emitting layer of the second light-emitting chip is disposed adjacent to the second base substrate,
the first light-emitting chip unit comprises:
  two first light-emitting chips mounted on the first base substrate apart from each other in a horizontal direction; and
  a phosphor covering the two first light-emitting chips,
the first light-emitting unit is disposed on the substrate such that a gap between the first light-emitting chips is positioned on or near a vertical axis extending through a lens optical axis of the lens, and
the gap between the first light-emitting chips has a width in the horizontal direction smaller than the width in the horizontal direction of a gap between the first light-emitting unit and the second light-emitting unit adjacent to the first light-emitting unit.

8. A vehicular lamp comprising:
a semiconductor light source; and
a lens disposed in front of the light source, wherein,
the light source comprises:
  a substrate;
  a first light-emitting unit comprising a first base substrate disposed on the substrate and disposed on or near a vertical axis extending through a lens optical axis of the lens; and
  a plurality of second light-emitting units each comprising a second base substrate disposed on the substrate and disposed on left and right outer sides of the first light-emitting unit in a horizontal direction,
the first light-emitting unit comprises a first light-emitting chip unit comprising a first light-emitting chip mounted on the first base substrate,
the second light-emitting units each comprises a second light-emitting chip unit comprising a second light-emitting chip mounted on the second base substrate, and
the thicknesses of the first base substrate and the second base substrates gradually differ from the first base substrate toward left and right outer sides in the horizontal direction.

9. The vehicular lamp according to claim 8, wherein the thicknesses are smallest at the left and right outermost sides in the horizontal direction.

* * * * *